United States Patent
Kim et al.

(10) Patent No.: US 9,793,235 B2
(45) Date of Patent: Oct. 17, 2017

(54) SEMICONDUCTOR PACKAGE HAVING A BUMP BONDING STRUCTURE

(71) Applicant: SK hynix Inc., Icheon-si, Gyeonggi-do (KR)

(72) Inventors: Ki Young Kim, Seongnam-si (KR); In Chul Hwang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/139,072

(22) Filed: Apr. 26, 2016

(65) Prior Publication Data

US 2017/0200688 A1    Jul. 13, 2017

(30) Foreign Application Priority Data

Jan. 11, 2016  (KR) .................. 10-2016-0003180

(51) Int. Cl.
| | |
|---|---|
| *H01L 23/48* | (2006.01) |
| *H01L 23/00* | (2006.01) |
| *H01L 23/498* | (2006.01) |
| *H01L 23/31* | (2006.01) |

(52) U.S. Cl.
CPC .......... *H01L 24/17* (2013.01); *H01L 23/3128* (2013.01); *H01L 23/3135* (2013.01); *H01L 23/3142* (2013.01); *H01L 23/49827* (2013.01); *H01L 23/49838* (2013.01); *H01L 2224/136* (2013.01); *H01L 2224/13012* (2013.01); *H01L 2224/13016* (2013.01); *H01L 2224/13147* (2013.01); *H01L 2224/16227* (2013.01);

(Continued)

(58) Field of Classification Search
CPC ......... H01L 24/16; H01L 24/17; H01L 24/24; H01L 24/25; H01L 23/49816; H01L 2224/0401; H01L 2224/32245; H01L 2224/83; H01L 2224/81; H01L 24/81; H01L 2224/16227; H01L 2225/06513; H01L 2225/1058; H01L 21/563; H01L 2224/12105; H01L 2224/73253

See application file for complete search history.

(56) References Cited

U.S. PATENT DOCUMENTS

| | | | |
|---|---|---|---|
| 2011/0101523 A1* | 5/2011 | Hwang | H01L 24/11 257/737 |
| 2011/0133334 A1* | 6/2011 | Pendse | H01L 21/76885 257/737 |

(Continued)

*Primary Examiner* — Khiem D Nguyen
(74) *Attorney, Agent, or Firm* — William Park & Associates Ltd.

(57) ABSTRACT

A semiconductor package may be provided. The semiconductor package may include a substrate having a first surface over which bond fingers are arranged, the other surface facing away from the first surface and over which ball lands are arranged, and terminals which are respectively formed over the bond fingers. The semiconductor package may include a semiconductor chip disposed over the first surface of the substrate, and having an active surface facing the first surface and over which bonding pads are arranged. The semiconductor package may include bumps respectively formed over the bonding pads of the semiconductor chip, and including pillars and layers which are formed over first side surfaces of the pillars and are joined with the terminals of the substrate.

19 Claims, 4 Drawing Sheets

(52) U.S. Cl.
CPC ............. *H01L 2924/1434* (2013.01); *H01L 2924/15311* (2013.01); *H01L 2924/3512* (2013.01)

(56) References Cited

U.S. PATENT DOCUMENTS

2012/0205797 A1\* 8/2012 Bae ................... H01L 23/49816
  257/737
2014/0312512 A1\* 10/2014 Choi ................... H01L 21/4846
  257/779
2014/0346673 A1\* 11/2014 Lin .................... H01L 23/3157
  257/737
2015/0171038 A1 6/2015 Lin et al.

\* cited by examiner

SEMICONDUCTOR PACKAGE HAVING A BUMP BONDING STRUCTURE

CROSS-REFERENCE TO RELATED APPLICATION

The present application claims priority under 35 U.S.C. §119(a) to Korean Patent Application No. 10-2016-0003180 filed in the Korean Intellectual Property Office on Jan. 11, 2016, which is incorporated herein by reference in its entirety.

BACKGROUND

1. Technical Field

Various embodiments generally relate to a semiconductor package, and more particularly, to a semiconductor package having a bump bonding structure.

2. Related Art

As electronic products that are highly functionalized are gradually downsized, semiconductor chips with higher capacities are needed to satisfy the desired functions of the electronic products. Also, as the electronic products are gradually downsized it is necessary to mount an increased number of semiconductor chips on a smaller-sized electronic product.

In this regard, there are limitations related to the technology for manufacturing a semiconductor chip with higher capacities and for mounting an increased number of semiconductor packages in a limited space. However, a recent technology development is trending toward embedding an increased number of semiconductor chips in a single package.

As such, bumps may be used as an electrical connection means between a substrate and a semiconductor chip. The bumps may provide short electrical paths, thereby allowing for high speed operation of the semiconductor chip.

SUMMARY

In an embodiment, a semiconductor package may be provided. The semiconductor package may include a substrate having a first surface over which a plurality of bond fingers are arranged, the other surface facing away from the first surface and over which a plurality of ball lands are arranged, and terminals which are respectively formed over the bond fingers. The semiconductor package may include a semiconductor chip disposed over the first surface of the substrate, and having an active surface facing the first surface and over which a plurality of bonding pads are arranged. The semiconductor package may include bumps respectively formed over the bonding pads of the semiconductor chip, and including pillars and layers which are formed over first side surfaces of the pillars and are joined with the terminals of the substrate.

In an embodiment, a semiconductor package may be provided. The semiconductor package may include a substrate formed with a plurality of grooves, and having a first surface over which U-shaped bond fingers are formed over surfaces of the grooves and other surface facing away from the first surface and over which a plurality of ball lands are arranged. The semiconductor package may include a semiconductor chip disposed over the first surface of the substrate, and having an active surface facing the first surface and over which a plurality of bonding pads are arranged. The semiconductor package may include bumps respectively formed over the bonding pads of the semiconductor chip, and including pillars and layers which are formed over first side surfaces of the pillars, partial heights of the pillars and the layers being inserted into the grooves and inserted portions of the layers being joined with portions of the bond fingers over sidewalls of the grooves.

In an embodiment, an electronic system may be provided. The electronic system applied with a semiconductor package may include a controller, an interface, an input/output unit and a memory device which are coupled by a bus, and the controller and the memory device may include a semiconductor package. The semiconductor package may include a substrate having a first surface over which a plurality of bond fingers are arranged, an other surface facing away from the first surface and over which a plurality of ball lands are arranged, and terminals which are respectively formed over the bond fingers. The semiconductor package may include a semiconductor chip disposed over the first surface of the substrate, and having an active surface facing the first surface and over which a plurality of bonding pads are arranged. The semiconductor package may include bumps respectively formed over the bonding pads of the semiconductor chip, and including pillars and layers which are formed over first side surfaces of the pillars and are joined with the terminals of the substrate.

In an embodiment, a memory card may be provided. The memory card may include a semiconductor package. The semiconductor package may include a memory including a semiconductor package and a memory controller which controls the memory. The semiconductor package may include a substrate having a first surface over which a plurality of bond fingers are arranged, an other surface facing away from the first surface and over which a plurality of ball lands are arranged, and terminals which are respectively formed over the bond fingers. The semiconductor package may include a semiconductor chip disposed over the first surface of the substrate, and having an active surface facing the first surface and over which a plurality of bonding pads are arranged. The semiconductor package may include bumps respectively formed over the bonding pads of the semiconductor chip, and including pillars and layers which are formed over first side surfaces of the pillars and are joined with the terminals of the substrate.

DETAILED DESCRIPTION

Various embodiments may be directed to a semiconductor package capable of substantially preventing a solder crack and a non-wet defect in a fine bump pitch structure.

Hereinafter, a semiconductor package having a lateral bump bonding structure may be described below with reference to the accompanying drawings through various examples of embodiments.

Figure 1:
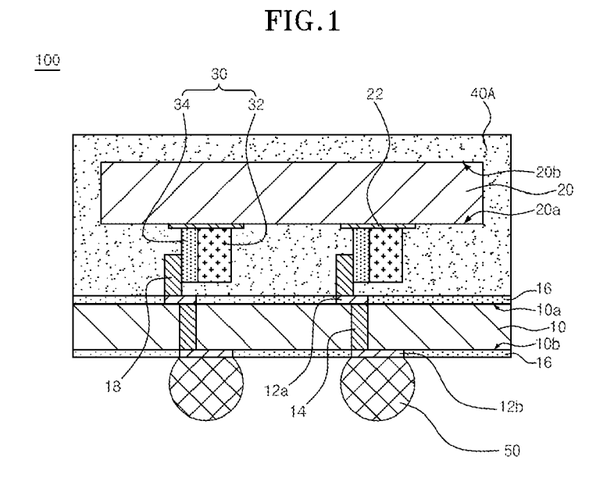
FIG. 1 is a cross-sectional view illustrating a representation of an example of a semiconductor package in accordance with an embodiment.

Referring to FIG. 1, a semiconductor package 100 in accordance with an embodiment may include a substrate 10, a semiconductor chip 20, and bumps 30. The semiconductor package 100 in accordance with an embodiment may include an encapsulation member 40A and external connection members 50.

The substrate 10 may be, for example, a printed circuit board, or the substrate 10 may be, for example, a silicon substrate or a glass substrate. The substrate 10 may have a substantially quadrangular, plate, or quadrangular plate shape. The substrate 10 may have a first surface 10a which corresponds to a top surface and the other surface 10b which faces away from the first surface 10a and corresponds to a bottom surface. The substrate 10 may include a plurality of bond fingers 12a which are arranged on the first surface 10a. The substrate 10 may include a plurality of ball lands 12b which are arranged on the other surface 10b. The substrate 10 may include internal wiring lines 14 formed therein. While not illustrated, the internal wiring lines 14 may include vias and horizontal wiring lines. The bond fingers 12a arranged on the first surface 10a of the substrate 10 and the ball lands 12b arranged on the other surface 10b of the substrate 10 may be electrically connected by the internal wiring lines 14.

While not illustrated, the substrate 10 may include connection wiring lines which are formed to connect the internal wiring lines 14 with the bond fingers 12a and the ball lands 12b.

The substrate 10 may include solder resists 16 which are formed on the first surface 10a and the other surface 10b in such a way as to expose the bond fingers 12a and the ball lands 12b. The substrate 10 may include terminals 18 which are respectively formed on the bond fingers 12a. The terminals 18 may be formed to project from the first surface 10a of the substrate 10, or from the bond fingers 12a arranged on the first surface 10a of the substrate 10. For example, the terminals 18 may have a bar shape, and may be formed on portions of the bond fingers 12a to project from the first surface 10a of the substrate 10.

The semiconductor chip 20 may be, for example but not limited to, a memory chip or a logic chip. The semiconductor chip 20 may have a substantially quadrangular, plate, or quadrangular plate shape. The semiconductor chip 20 may have an active surface 20a and a back surface 20b which faces away from the active surface 20a. The semiconductor chip 20 may be disposed over the first surface 10a of the substrate 10 such that the active surface 20a thereof faces the first surface 10a of the substrate 10. The semiconductor chip 20 may include a plurality of bonding pads 22 which are arranged on the active surface 20a. The semiconductor chip 20 may be disposed over the substrate 10 such that the bonding pads 22 are positioned substantially over the bond fingers 12a of the substrate 10.

The bumps 30 may be formed on the bonding pads 22, respectively, of the semiconductor chip 20. Each of the bumps 30 may include a pillar 32 and a layer 34. In an embodiment, the pillar 32 may include metal. In an embodiment, the layer 34 may include metal. In an embodiment, the pillar 32 may have a higher melting point than the layer 34, or the layer 34 may have a lower melting point than the pillar 32. For example, the high melting point metal pillar 32 may include copper, and the low melting point metal layer 34 may include solder. Each of pillars 32 may substantially have the shape of a polyprism, for example, substantially the shape of a square, prism, or square prism. The pillars 32 may be formed to project from the active surface 20a of the semiconductor chip 20 toward the first surface 10a of the substrate 10, or project from the bonding pads 22 arranged on the active surface 20a. Layers 34 may be formed on first side surfaces of the pillars 32. For example, the layers 34 may be formed on first side surfaces of the pillars 32 which face the terminals 18 of the substrate 10, on the bonding pads 22 of the semiconductor chip 20. The layers 34 may be formed such that first side surfaces thereof contact the pillars 32 and top surfaces thereof contact the bonding pads 22.

In an embodiment, the bumps 30 and the terminals 18 of the substrate 10 may be joined with each other through the layers 34. For example, the layers 34 may have first side surfaces which contact the pillars 32 and the other side surfaces which face away from the first side surfaces and contact the terminals 18 of the substrate 10. Accordingly, the semiconductor package 100 in accordance with an embodiment may have a lateral bump bonding structure.

The encapsulation member 40A may be formed to protect the semiconductor chip 20 from external influences. The encapsulation member 40A may be formed on the first surface 10a of the substrate 10 including the solder resist 16 in such a way as to cover the semiconductor chip 20. For example, the encapsulation member 40A may be formed of an epoxy molding compound.

The external connection members 50 may be formed as means for mounting the semiconductor package 100 to an external circuit. The external connection members 50 may be respectively formed on the ball lands 12b which are arranged on the other surface 10b of the substrate 10. The external connection members 50 may include solder balls. In an embodiment, the external connection members 50 may include conductive pins or a conductive paste.

In the semiconductor package 100 in accordance with an above-described embodiment, it may be possible to prevent occurrence of a solder crack and a non-wet defect between solder and the substrate 10 that are otherwise likely to occur in fine pitch bumps.

In the conventional art, in order to realize fine pitch bumps, copper pillar bumps in which solder layers are disposed on copper pillars are used. In the copper pillar bumps, a bump height may be secured by using a copper pillar structure, and the solder layers may be joined with other bumps or other electrodes. In the case where bumps are constructed by using only solder, the bumps are likely to be deformed in a reflow process. Therefore, in order to ensure that the bumps have at least a predetermined height even after reflow, a large amount of solder is needed, and a large pitch is required to prevent bumps from short-circuiting from the solder. However, in an embodiment, since the copper pillar bumps use copper as a metal having a high melting point, to construct pillars, the copper pillar bumps are not deformed, and thus, realization of a small pitch is possible.

Since the copper pillar bumps use solder for connection, in order to decrease a bump pitch, the volume of the solder should be reduced to prevent the bumps from short-circuiting by the solder. If warpage occurs in a substrate or/and a semiconductor chip by heat in the reflow process, the gap between the substrate and the semiconductor chip changes. Then, a compressive force or a tensile force is applied to the solder which connects the substrate and the semiconductor chip. Deformation of the solder by the tensile force causes solder elongation. As a consequence, as the thickness of the solder decreases and the solder becomes invulnerable to an external force, a solder crack may occur. When the gap between the substrate and the semiconductor chip increases, a non-wet defect in which a junction is not formed may occur.

In the lateral bump bonding structure according to an embodiment, since the terminals 18 of the substrate 10 and the pillars 32 are bonded to each other by the layers 34 which are formed on the side surfaces of the pillars 32, the junction area between the pillars 32 and the terminals 18 of the substrate 10 may be increased when compared to the junction area of the conventional copper pillar bumps. Further, since the high melting point metal pillars 32 can be used to support the low melting point metal layers 34 to allow the layers 34 to retain a vertically disposed shape, it is not needed to form a large volume of the layers 34 to retain a necessary bump height. Accordingly, in an embodiment, the bumps 30 may be disposed with a fine pitch.

Figure 2:
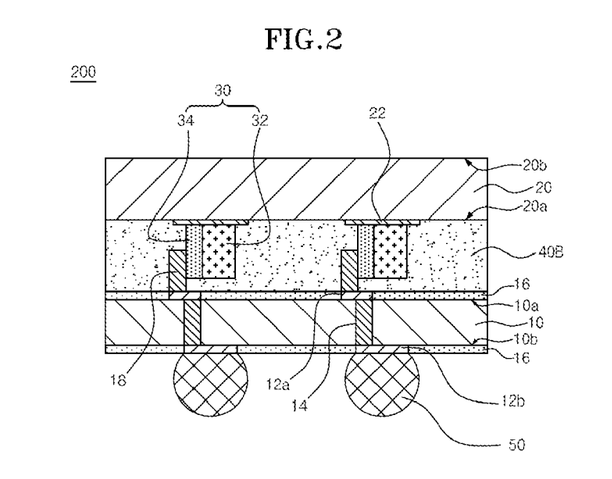
FIG. 2 is a cross-sectional view illustrating a representation of an example of a semiconductor package in accordance with an embodiment.

Referring to FIG. 2, a semiconductor package 200 in accordance with an embodiment may include a substrate 10, a semiconductor chip 20, and bumps 30. The semiconductor package 200 in accordance with an embodiment may include an underfill member 40B and external connection members 50.

The substrate 10 may have a substantially quadrangular, plate, or quadrangular plate shape. The substrate 10 may have first surface 10a and the other surface 10b which faces away from the first surface 10a. The substrate 10 may include a plurality of bond fingers 12a which are arranged on the first surface 10a and a plurality of ball lands 12b which are arranged on the other surface 10b. The substrate 10 may include internal wiring lines 14 which are formed in the substrate 10 to connect the bond fingers 12a arranged on the first surface 10a and the ball lands 12b arranged on the other surface 10b. The internal wiring lines 14 may include vias and horizontal wiring lines. While not illustrated, the substrate 10 may further include connection wiring lines which are formed to connect the internal wiring lines 14 with the bond fingers 12a and the ball lands 12b.

The substrate 10 may include solder resists 16 which are formed on the first surface 10a and the other surface 10b in such a way as to expose the bond fingers 12a and the ball lands 12b. The substrate 10 may include terminals 18 which are respectively formed on the bond fingers 12a. The terminals 18 may have a bar shape, and may be formed on portions of the bond fingers 12a to project from the first surface 10a of the substrate 10, or from the bond fingers 12a arranged on the first surface 10a of the substrate 10.

The semiconductor chip 20 may be a memory chip or a logic chip. The semiconductor chip 20 may be a memory chip which has a substantially quadrangular, plate, or quadrangular plate shape. The semiconductor chip 20 may have an active surface 20a and a back surface 20b which faces away from the active surface 20a. The semiconductor chip 20 may be disposed over the first surface 10a of the substrate 10 such that the active surface 20a faces the first surface 10a of the substrate 10. The semiconductor chip 20 may include a plurality of bonding pads 22 which are arranged on the active surface 20a.

The bumps 30 may be formed on the bonding pads 22, respectively, of the semiconductor chip 20. Each of the bumps 30 may include a pillar 32 and a layer 34. In an embodiment, the pillar 32 may include metal. In an embodiment, the layer 34 may include metal. In an embodiment, the pillar 32 may have a higher melting point than the layer 34, or the layer 34 may have a lower melting point than the pillar 32. For example, the high melting point metal pillar 32 may include copper, and the low melting point metal layer 34 may include solder. The pillars 32 may be formed to project from the active surface 20a of the semiconductor chip 20 toward the first surface 10a of the substrate 10, or project from the bonding pads 22 arranged on the active surface 20a. The 34 may be formed on one or more of the side surfaces of the pillars 32 which face the terminals 18 of the substrate 10, on the bonding pads 22 of the semiconductor chip 20. The layers 34 may be formed such that one or more of the side surfaces thereof contact the pillars 32 and one or more top surfaces thereof contact the bonding pads 22.

In an embodiment, the bumps 30 and the terminals 18 of the substrate 10 may be joined through the layers 34. For example, the low layers 34 may have one or more side surfaces which contact the pillars 32 and the other side surfaces which face away from the first side surfaces and contact the terminals 18 of the substrate 10. Accordingly, the semiconductor package 200 may have a lateral bump bonding structure.

The underfill member 40B may be filled in the space between the substrate 10 and the semiconductor chip 20. The underfill member 40B may be formed to protect the semiconductor chip 20 from external influences. The underfill member 40B may be formed of various insulating materials.

The external connection members 50 may be respectively formed on the ball lands 12b which are arranged on the other surface 10b of the substrate 10. The external connection members 50 may include solder balls. In an embodiment, the external connection members 50 may include conductive pins or a conductive paste. [Do these embodiments related to FIG. 2 also prevent solder cracks? Perhaps a new paragraph like original paragraph 27 should be entered here after original paragraph 38 if this is the case.]

Figure 3:
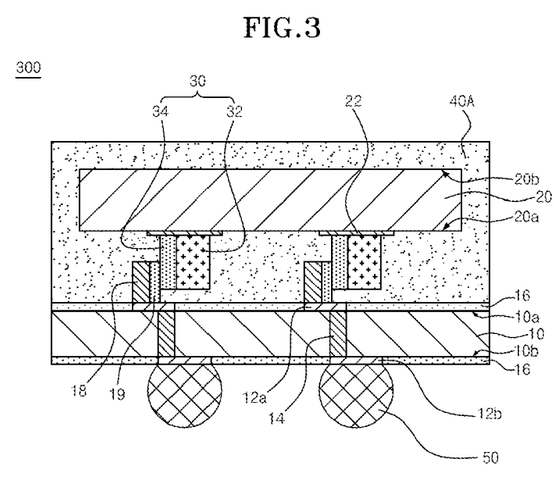
FIG. 3 is a cross-sectional view illustrating a representation of an example of a semiconductor package in accordance with an embodiment.

Referring to FIG. 3, a semiconductor package 300 in accordance with an embodiment may include a substrate 10, a semiconductor chip 20, and bumps 30. The semiconductor package 300 in accordance with an embodiment may include an encapsulation member 40A and external connection members 50.

The substrate 10 may be a printed circuit board, a silicon substrate or a glass substrate. The substrate 10 may have a substantially quadrangular, plate, or quadrangular plate shape. The substrate 10 may have a first surface 10a and the other surface 10b which faces away from the first surface 10a. The substrate 10 may include a plurality of bond fingers 12a which are arranged on the first surface 10a and a plurality of ball lands 12b which are arranged on the other surface 10b. The substrate 10 may include internal wiring lines 14 which are formed in the substrate 10 to connect the bond fingers 12a arranged on the first surface 10a and the ball lands 12b arranged on the other surface 10b. The internal wiring lines 14 may include vias and horizontal wiring lines. While not illustrated, the substrate 10 may further include connection wiring lines which are formed to connect the internal wiring lines 14 with the bond fingers 12a and the ball lands 12b.

The substrate 10 may include solder resists 16 which are formed on the first surface 10a and the other surface 10b in such a way as to expose the bond fingers 12a and the ball lands 12b. The substrate 10 may include terminals 18 which are respectively formed on the bond fingers 12a. The terminals 18 may have a bar shape, and may be formed on portions of the bond fingers 12a to project from the first surface 10a of the substrate 10, or from the bond fingers 12a arranged on the first surface 10a of the substrate 10. The substrate 10 may include additional layers 19 which are respectively formed on side surfaces of the terminals 18. In an embodiment, the additional layers 19 may be realized with metal. In an embodiment, the additional layers 19 may have a lower melting point than the pillar 32. In an embodiment, the additional layers 19 may have a melting point substantially the same as the layer 34. The additional layers 19 may include, for example, solder. In an embodiment, the additional layers 19 may be formed on side surfaces of the terminals 18 which face the bumps 30 which are to be described below.

The semiconductor chip 20 may be a memory chip or a logic chip. The semiconductor chip 20 may have a substantially quadrangular, plate, or quadrangular plate shape. The semiconductor chip 20 may have an active surface 20a and a back surface 20b which faces away from the active surface 20a. The semiconductor chip 20 may be disposed over the first surface 10a of the substrate 10 such that the active surface 20a faces the first surface 10a of the substrate 10. The semiconductor chip 20 may include a plurality of bonding pads 22 which are arranged on the active surface 20a.

The bumps 30 may be formed on the bonding pads 22, respectively, of the semiconductor chip 20. Each of the bumps 30 may include a pillar 32 and a layer 34. In an embodiment, the pillar 32 may include metal. In an embodiment, the layer 34 may include metal. In an embodiment, the pillar 32 may have a higher melting point than the layer 34, or the layer 34 may have a lower melting point than the pillar 32. For example, the high melting point metal pillar 32 may include copper, and the low melting point metal layer 34 may include solder. The pillars 32 may be formed to project from the active surface 20a of the semiconductor chip 20 toward the first surface 10a of the substrate 10, or project from the bonding pads 22 arranged on the active surface 20a. Layers 34 may be formed on one or more side surfaces of the pillars 32 which face the terminals 18 of the substrate 10, on the bonding pads 22 of the semiconductor chip 20.

The layers 34 may be respectively joined with the additional layers 19 which are formed on the side surfaces of the terminals 18. Namely, first side surfaces of the additional layers 19 contact the terminals 18. First side surfaces of the layers 34 contact the pillars 32. The other side surfaces of the additional layers 19 which face away from the first side surfaces contact the other side surfaces of the low melting point metal layers 34 which face away from the first side surfaces. Accordingly, the pillars 32 of the bumps 30 and the terminals 18 of the substrate 10 may be electrically coupled with each other by the additional layers 19 and the layers 34. The semiconductor package 300 in accordance with an embodiment may have a lateral bump bonding structure.

The encapsulation member 40A may be formed to protect the semiconductor chip 20 from external influences. The encapsulation member 40A may be formed on the first surface 10a of the substrate 10 including the solder resist 16 in such a way as to cover the semiconductor chip 20. The encapsulation member 40A may be formed of an epoxy molding compound.

The external connection members 50 may be respectively formed on the ball lands 12b which are arranged on the other surface 10b of the substrate 10. The external connection members 50 may include solder balls. In an embodiment, the external connection members 50 may include conductive pins or a conductive paste.

Figure 4:
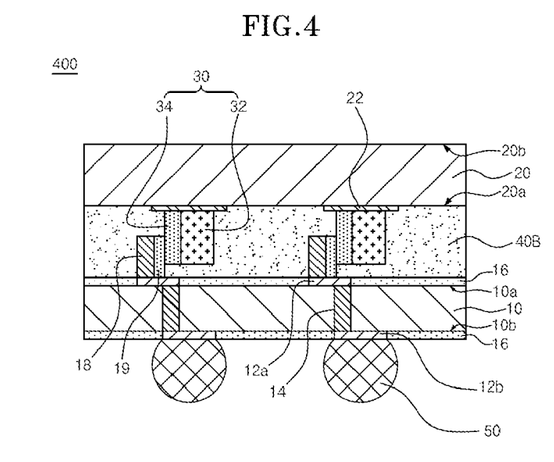
FIG. 4 is a cross-sectional view illustrating a representation of an example of a semiconductor package in accordance with an embodiment.

Referring to FIG. 4, a semiconductor package 400 in accordance with an embodiment may include a substrate 10, a semiconductor chip 20, and bumps 30. The semiconductor package 400 in accordance with an embodiment may include an underfill member 40B and external connection members 50.

The substrate 10 may have a substantially quadrangular, plate, or quadrangular plate shape. The substrate 10 may have a first surface 10a and the other surface 10b which faces away from the first surface 10a. The substrate 10 may include a plurality of bond fingers 12a which are arranged on the first surface 10a and a plurality of ball lands 12b which are arranged on the other surface 10b. The substrate 10 may include internal wiring lines 14 which are formed in the substrate 10 to connect the bond fingers 12a arranged on the first surface 10a and the ball lands 12b arranged on the other surface 10b. The substrate 10 may include solder resists 16 which are respectively formed on the first surface 10a and the other surface 10b in such a way as to expose the bond fingers 12a and the ball lands 12b.

The substrate 10 may include terminals 18 which are respectively formed on the bond fingers 12a. The terminals 18 may have a bar shape, and may be formed on portions of the bond fingers 12a to project from the first surface 10a of the substrate 10, or from the bond fingers 12a arranged on the first surface 10a of the substrate 10. The substrate 10 may include additional layers 19 which are respectively formed on side surfaces of the terminals 18. In an embodiment, the additional layers 19 may include solder. The additional layers 19 may be formed on side surfaces of the terminals 18 which face the bumps 30 of the semiconductor chip 20.

The semiconductor chip 20 may have a substantially quadrangular, plate, or quadrangular plate shape. The semiconductor chip 20 may have an active surface 20a and a back surface 20b which faces away from the active surface 20a. The semiconductor chip 20 may be disposed over the first surface 10a of the substrate 10 such that the active surface 20a faces the first surface 10a of the substrate 10. The semiconductor chip 20 may include a plurality of bonding pads 22 which are arranged on the active surface 20a.

The bumps 30 may be formed on the bonding pads 22, respectively, of the semiconductor chip 20. Each of the bumps 30 may include a pillar 32 and a layer 34. In an embodiment, the pillar 32 may include metal. In an embodiment, the layer 34 may include metal. In an embodiment, the pillar 32 may have a higher melting point than the layer 34, or the layer 34 may have a lower melting point than the pillar 32. For example, the high melting point metal pillar 32 may include copper, and the low melting point metal layer 34 may include solder. The pillars 32 may be formed to project from the active surface 20a of the semiconductor chip 20 toward the first surface 10a of the substrate 10, or project from the bonding pads 22 arranged on the active surface 20a. Layers 34 may be formed on first side surfaces of the high melting point metal pillars 32 which face the terminals 18 of the substrate 10, on the bonding pads 22 of the semiconductor chip 20.

The layers 34 may be respectively joined with the additional layers 19 which are formed on the side surfaces of the terminals 18. Accordingly, the semiconductor package 400 in accordance with an embodiment may have a structure in which the side surfaces of the terminals 18 of the substrate 10 and the other side surfaces of the pillars 32 are electrically coupled with each other by the additional layers 19 and the layers 34. As a consequence, the semiconductor package 400 in accordance with an embodiment may have a lateral bump bonding structure.

The underfill member 40B may be filled in the space between the substrate 10 and the semiconductor chip 20. The underfill member 40B may be formed to protect the semiconductor chip 20 from external influences. The underfill member 40B may be formed of various insulating materials.

The external connection members 50 may be respectively formed on the ball lands 12b which are arranged on the other surface 10b of the substrate 10. The external connection members 50 may include solder balls. In an embodiment, the external connection members 50 may include conductive pins or a conductive paste.

Figure 5:
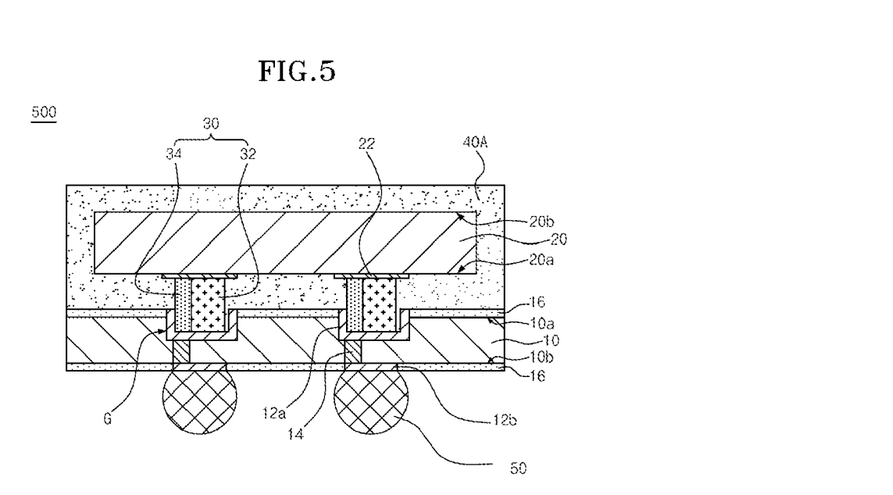
FIG. 5 is a cross-sectional view illustrating a representation of an example of a semiconductor package in accordance with an embodiment.

Referring to FIG. 5, a semiconductor package 500 in accordance with an embodiment may include a substrate 10, a semiconductor chip 20, and bumps 30. The semiconductor package 500 in accordance with an embodiment may include an encapsulation member 40A and external connection members 50.

The substrate 10 may be a printed circuit board, a silicon substrate or a glass substrate. The substrate 10 may have a substantially quadrangular, plate, or quadrangular plate shape. The substrate 10 may have a first surface 10a and the other surface 10b which faces away from the first surface 10a. The substrate 10 may include a plurality of grooves G which are formed on the first surface 10a. The substrate 10 may include a plurality of bond fingers 12a which are formed on the surfaces of the respective grooves G. The bond fingers 12a may have a U shape. The bond fingers 12a may be formed through, for example, copper plating. The U-shaped bond fingers 12a may play the role of terminals in the aforementioned embodiments. The respective grooves G including the bond fingers 12a may have a size capable of being inserted with the bumps 30 which will be described below. The grooves G may be formed in a dot type by a plural number on the first surface 10a of the substrate 10 in correspondence to the respective bumps 30. While not illustrated, the grooves G may be formed in a line type in a plurality of numbers on the first surface 10a of the substrate 10.

The substrate 10 may include a plurality of ball lands 12b which are arranged on the other surface 10b. The substrate 10 may include internal wiring lines 14 formed therein. The internal wiring lines 14 may include vias and horizontal wiring lines. The internal wiring lines 14 may be formed to interconnect the bond fingers 12a and the ball lands 12b. While not illustrated, the substrate 10 may further include connection wiring lines which are formed to connect the internal wiring lines 14 with the bond fingers 12a and the ball lands 12b.

The substrate 10 may include solder resists 16 which are formed on the first surface 10a and the other surface 10b in such a way as to expose the bond fingers 12a and the ball lands 12b.

The semiconductor chip 20 may be a memory chip or a logic chip. The semiconductor chip 20 may have a substantially quadrangular, plate, or quadrangular plate shape. The semiconductor chip 20 may have an active surface 20a and a back surface 20b which faces away from the active surface 20a. The semiconductor chip 20 may include a plurality of bonding pads 22 which are arranged on the active surface 20a. The semiconductor chip 20 may be disposed over the first surface 10a of the substrate 10 such that the active surface 20a faces the first surface 10a of the substrate 10.

The bumps 30 may be formed on the bonding pads 22, respectively, of the semiconductor chip 20. Each of the bumps 30 may include a pillar 32 and a layer 34. In an embodiment, the pillar 32 may include metal. In an embodiment, the layer 34 may include metal. In an embodiment, the pillar 32 may have a higher melting point than the layer 34, or the layer 34 may have a lower melting point than the pillar 32. For example, the high melting point metal pillar 32 may include copper, and the low melting point metal layer 34 may include solder. The pillars 32 may be formed to project from the active surface 20a of the semiconductor chip 20 toward the first surface 10a of the substrate 10, or or project from the bonding pads 22 arranged on the active surface 20a. The layers 34 may be formed on first side surfaces of the high melting point metal pillars 32, on the bonding pads 22.

According to an embodiment, in the semiconductor chip 20 including the bumps 30, partial heights of the bumps 30 are respectively inserted into the grooves G of the substrate 10 on the first surface 10a of the substrate 10. The layers 34 may contact portions of the bond fingers 12a which are formed on first sidewalls of the grooves G. The portions of the bond fingers 12a which are formed on the first sidewalls of the grooves G may play the role of terminals in the aforementioned embodiments. Accordingly, the pillars 32 of the bumps 30 and the portions of the bond fingers 12a disposed on the first sidewalls of the grooves G may be electrically coupled with each other by the layers 34. As a consequence, the semiconductor package 500 in accordance with an embodiment may have a lateral bump bonding structure.

The encapsulation member 40A may be formed on the first surface 10a of the substrate 10 including the solder resist 16 in such a way as to cover the semiconductor chip 20. The encapsulation member 40A may be formed of an epoxy molding compound.

The external connection members 50 may be respectively formed on the ball lands 12b which are arranged on the other surface 10b of the substrate 10. The external connection members 50 may include solder balls. In an embodiment, the external connection members 50 may include conductive pins or a conductive paste.

Figure 6:
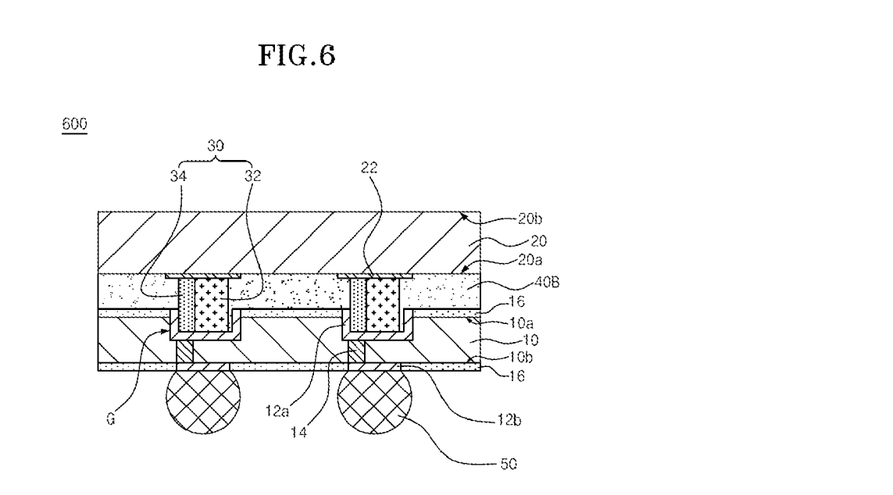
FIG. 6 is a cross-sectional view illustrating a representation of an example of a semiconductor package in accordance with an embodiment.

Referring to FIG. 6, a semiconductor package 600 in accordance with an embodiment may include a substrate 10, a semiconductor chip 20, and bumps 30. The semiconductor package 600 in accordance with an embodiment may include an underfill member 40B and external connection members 50.

The substrate 10 may have a substantially quadrangular, plate, or quadrangular plate shape. The substrate 10 may have a first surface 10a and the other surface 10b which faces away from the first surface 10a. The substrate 10 may include a plurality of grooves G which are formed on the first surface 10a. The substrate 10 may include a plurality of bond fingers 12a which are formed on the surfaces of the respective grooves G. The bond fingers 12a may have a U shape. The bond fingers 12a may be formed through copper plating. The U-shaped bond fingers 12a may play the role of terminals in the aforementioned embodiments.

The substrate 10 may include a plurality of ball lands 12b which are arranged on the other surface 10b. The substrate 10 may include internal wiring lines 14 formed therein to connect the bond fingers 12a and the ball lands 12b. The internal wiring lines 14 may include vias and horizontal wiring lines. While not illustrated, the substrate 10 may further include connection wiring lines which are formed to connect the internal wiring lines 14 with the bond fingers 12a and the ball lands 12b.

The substrate 10 may include solder resists 16 which are formed on the first surface 10a and the other surface 10b in such a way as to expose the bond fingers 12a and the ball lands 12b.

The semiconductor chip 20 may have a substantially quadrangular, plate, or quadrangular plate shape. The semiconductor chip 20 may have an active surface 20a and a back surface 20b which faces away from the active surface 20a. The semiconductor chip 20 may include a plurality of bonding pads 22 which are arranged on the active surface 20a thereof.

The bumps 30 may be formed on the bonding pads 22, respectively, of the semiconductor chip 20. Each of the bumps 30 may include a pillar 32 and a layer 34. In an embodiment, the pillar 32 may include metal. In an embodiment, the layer 34 may include metal. In an embodiment, the pillar 32 may have a higher melting point than the layer 34, or the layer 34 may have a lower melting point than the pillar 32. For example, the high melting point metal pillar 32 may include copper, and the low melting point metal layer 34 may include solder. The pillars 32 may be formed to project from the active surface 20a of the semiconductor chip 20 toward the first surface 10a of the substrate 10. The layers 34 may be formed on first side surfaces of the high melting point metal pillars 32, on the bonding pads 22.

The semiconductor chip 20 including the bumps 30 may be disposed on the first surface 10a of the substrate 10 in such a manner that partial heights of the bumps 30 are respectively inserted into the grooves G of the substrate 10 and the layers 34 contact portions of the bond fingers 12a which are formed on first sidewalls of the grooves G. Accordingly, in the semiconductor package 600 in accordance with an embodiment, the pillars 32 of the bumps 30 and the portions of the bond fingers 12a disposed on the first sidewalls of the grooves G may be joined with each other through the layers 34.

The underfill member 40B may be filled in the space between the substrate 10 and the semiconductor chip 20. The underfill member 40B may be formed to protect the semiconductor chip 20 from external influences. In an embodiment, the underfill member 40B may be formed to protect the semiconductor chip 20 from external influences similar to the encapsulation member. The underfill member 40B may be formed of various insulating materials.

The external connection members 50 may be respectively formed on the ball lands 12b which are arranged on the other surface 10b of the substrate 10. The external connection members 50 may include solder balls. in an embodiment, the external connection members 50 may include conductive pins or a conductive paste.

The semiconductor packages in accordance with the above-described various embodiments may be applied to various kinds of semiconductor devices and package modules having the same.

Figure 7:
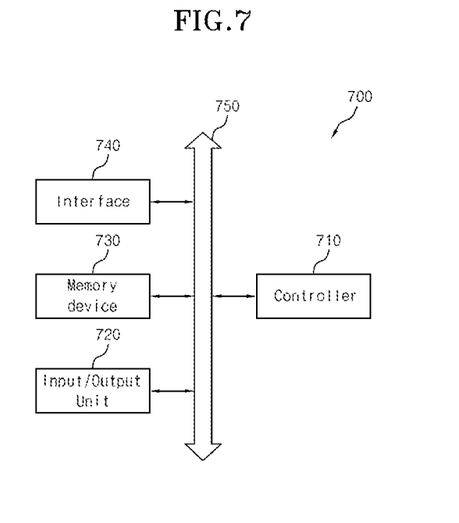
FIG. 7 is a block diagram illustrating a representation of an example of an electronic system which the semiconductor package in accordance with each of the various embodiments may be applied.

Referring to FIG. 7, an electronic system 700 to which the semiconductor devices in accordance with the various embodiments may be applied may include a controller 710, an input/output unit 720, and a memory device 730. The controller 710, the input/output unit 720 and the memory device 730 may be coupled with one another through a bus 750 which provides data movement paths.

For example, the controller 710 may include at least any one of a microprocessor, a digital signal processor, a microcontroller, and logic devices capable of performing similar functions to these components. The controller 710 and the memory device 730 may include the semiconductor packages in accordance with the various embodiments. The input/output unit 720 may include at least one selected among a keypad, a keyboard, a display device, and so forth.

The memory device 730 may store data and/or commands to be executed by the controller 710. The memory device 730 may include a volatile memory device such as a DRAM and/or a nonvolatile memory device such as a flash memory. For example, a flash memory may be mounted to an information processing system such as a mobile terminal and a desktop computer. Such a flash memory may be configured by an SSD (solid state drive). In this case, the electronic system 700 may stably store a large amount of data in a flash memory system.

Such an electronic system 700 may further include an interface 740 for transmitting data to a communication network or receiving data from a communication network. The interface 740 may be a wired or wireless type. For example, the interface 740 may include an antenna or a wired/wireless transceiver.

Although not illustrated, the electronic system 700 may further include an application chipset, a camera image processor (CIP), and so forth.

The electronic system 700 may be realized as a mobile system, a personal computer, a computer for an industrial use or a logic system which performs various functions. For example, the mobile system may be any one among a personal digital assistant (PDA), a portable computer, a web tablet, a mobile phone, a smart phone, a wireless phone, a laptop computer, a memory card, a digital music system and an information transmission/reception system.

In the case where the electronic system 700 is equipment capable of performing wireless communication, the electronic system 700 may be used in a communication system such as CDMA (code division multiple access), GSM (global system for mobile communication), NADC (North American digital cellular), E-TDMA (enhanced-time division multiple access), WCDMA (wideband code division multiple access), CDMA2000, LTE (long term evolution) and Wibro (wireless broadband Internet).

Figure 8:
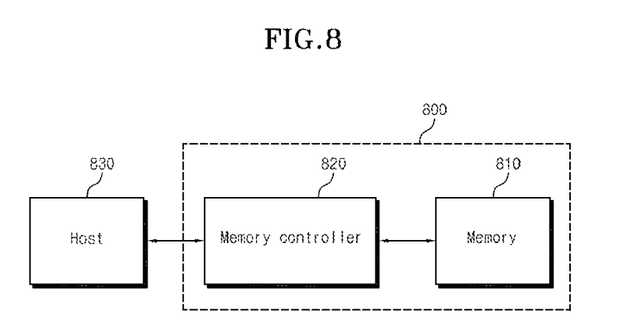
FIG. 8 is a block diagram illustrating a representation of an example of a memory card which the semiconductor package in accordance with each of the various embodiments may be applied.

Referring to FIG. 8, a memory card 800 may include the package-on-package type semiconductor devices in accordance with the various embodiments. The memory card 800 may include a memory 810 and a memory controller 820. For example, without a limiting sense, the memory 810 and the memory controller 820 may include a nonvolatile memory device. The memory 810 and the memory controller 820 may store data or read stored data.

The memory 810 may include at least any one among nonvolatile memory devices to which the semiconductor packages in accordance with the embodiments are applied. The memory controller 820 may control the memory 810 to read stored data or store data, in response to a read/write request from a host 830.

While various embodiments have been described above, it will be understood to those skilled in the art that the embodiments described are by way of example only. Accordingly, the semiconductor package having a lateral bump bonding structure described herein should not be limited based on the described embodiments.

What is claimed is:

1. A semiconductor package comprising:
    a substrate having a first surface over which a plurality of bond fingers are arranged, a second surface facing away from the first surface and over which a plurality of ball lands are arranged, and terminals which are respectively formed over the bond fingers;

a semiconductor chip disposed over the first surface of the substrate, and having an active surface facing the first surface and over which a plurality of bonding pads are arranged;

bumps respectively formed over the bonding pads of the semiconductor chip, each of the bumps including a pillar and a layer;

an encapsulation member formed between the bumps and the substrate, wherein the pillar is formed on one of the plurality of bonding pads to project from the active surface of the semiconductor chip toward the first surface of the substrate, wherein the layer has a first side surface which contacts a first side surface of the pillar, a second side surface which faces away from the first side surface of the layer and is joined with a side surface of one of the terminals of the substrate, and a top surface which contacts one of the plurality of bonding pads, wherein the contact between the second side surface of the layer and the side surface of one of the terminals of the substrate is the only point of contact between each of the bumps and each of the terminals.

2. The semiconductor package according to claim 1, wherein the terminals are formed to project from the first surface of the substrate.

3. The semiconductor package according to claim 2, wherein the terminals have a bar shape.

4. The semiconductor package according to claim 1, wherein the substrate comprises:
   internal wiring lines formed in the substrate to connect the bond fingers formed over the first surface and the ball lands formed over the other surface; and
   solder resists formed on the first surface and the other surface, respectively, to expose the bond fingers and the ball lands.

5. The semiconductor package according to claim 1, wherein the semiconductor chip is disposed over the first surface of the substrate such that the active surface thereof faces the first surface of the substrate and the layer of the bump is joined with the side surface of the terminal of the substrate.

6. The semiconductor package according to claim 1, wherein the pillar has a higher melting point than the layer.

7. The semiconductor package according to claim 6, wherein the pillar comprises copper, and the layers comprise solder.

8. The semiconductor package according to claim 7, wherein the pillar has the shape of a polyprism which has a first side surface over which the layer is formed.

9. The semiconductor package according to claim 1, wherein the substrate further comprises:
   an additional layer formed over a side surface of the terminal which face the layer of the bump.

10. The semiconductor package according to claim 9, wherein the additional layer comprises solder.

11. The semiconductor package according to claim 1, further comprising:
   the encapsulation member formed over the first surface of the substrate to substantially cover the semiconductor chip; and
   external connection members respectively formed over the ball lands of the substrate.

12. The semiconductor package according to claim 1, further comprising:
   an underfill member filled in a space between the substrate and the semiconductor chip; and
   external connection members respectively formed over the ball lands of the substrate.

13. A semiconductor package comprising:
   a substrate formed with a plurality of grooves, and having a first surface over which U-shaped bond fingers are formed over surfaces of the grooves and a second surface facing away from the first surface and over which a plurality of ball lands are arranged;
   a semiconductor chip disposed over the first surface of the substrate, and having an active surface facing the first surface and over which a plurality of bonding pads are arranged; and
   bumps respectively formed over the bonding pads of the semiconductor chip, each of the bump including a pillar and a layer,
   wherein the pillar is formed on one of the plurality of bonding pads to project from the active surface of the semiconductor chip toward the first surface of the substrate,
   wherein the layer has a first side surface which contact the first side surface of the pillar, a second side surface which faces away from the first side surface of the layer, and a top surface which contact one of the plurality of bonding pads,
   wherein a partial height of the pillar and the layer is inserted into the groove and the second side surface of the inserted portion of the layer is joined with a portion of the bond finger over sidewalls of the groove.

14. The semiconductor package according to claim 13, wherein the substrate comprises:
   internal wiring lines formed in the substrate to connect the bond fingers formed over the first surface and the ball lands formed over the other surface; and
   solder resists formed on the first surface and the other surface, respectively, to expose the bond fingers and the ball lands.

15. The semiconductor package according to claim 13, wherein the pillar has a higher melting point than the layer.

16. The semiconductor package according to claim 15, wherein the pillar comprises copper, and the layers comprise solder.

17. The semiconductor package according to claim 16, wherein the pillar has the shape of a polyprism which has a first side surface over which the layer is formed.

18. The semiconductor package according to claim 13, further comprising:
   an encapsulation member formed over the first surface of the substrate to substantially cover the semiconductor chip; and
   external connection members respectively formed over the ball lands of the substrate.

19. The semiconductor package according to claim 13, further comprising:
   an underfill member filled in a space between the substrate and the semiconductor chip; and
   external connection members respectively formed over the ball lands of the substrate.

* * * * *